United States Patent [19]
Stekelenburg

[11] Patent Number: 5,325,412
[45] Date of Patent: Jun. 28, 1994

[54] CHARGE-COUPLED DEVICE, IMAGE SENSOR ARRANGEMENT AND CAMERA PROVIDED WITH SUCH AN IMAGE SENSOR ARRANGEMENT

[75] Inventor: Michael A. W. Stekelenburg, Eindhoven, Netherlands

[73] Assignee: U.S. Philips Corporation, New York, N.Y.

[21] Appl. No.: 18,903

[22] Filed: Feb. 17, 1993

Related U.S. Application Data

[63] Continuation of Ser. No. 794,350, Nov. 12, 1991, abandoned, which is a continuation of Ser. No. 525,275, May 17, 1990, abandoned.

[30] Foreign Application Priority Data

May 23, 1989 [NL] Netherlands .................. 8901283

[51] Int. Cl.⁵ .................. H04N 5/217; G11C 27/04; G11C 19/28; H01L 27/14
[52] U.S. Cl. .................. 377/58; 377/62; 257/223; 257/230; 348/243; 348/314
[58] Field of Search .......... 357/24 M, 24 LR; 377/57, 58, 60, 61, 62, 63; 257/223, 230, 231, 241; 358/213.16, 213.19

[56] References Cited

U.S. PATENT DOCUMENTS

| | | | |
|---|---|---|---|
| 4,229,752 | 10/1980 | Hynecek | 357/24 M |
| 4,328,432 | 5/1982 | Yamazaki | 377/58 |
| 4,485,315 | 11/1984 | Collet et al. | 377/58 |
| 4,562,363 | 12/1985 | Jones et al. | 357/24 M |
| 4,679,212 | 7/1987 | Hynecek | 377/58 |
| 4,779,124 | 10/1988 | Hynecek | 357/24 M |
| 4,868,855 | 9/1989 | Boudewijns et al. | 357/24 LR |
| 4,963,952 | 10/1990 | Janesick | 257/228 |
| 5,008,758 | 4/1991 | Burke | 257/222 |
| 5,115,458 | 5/1992 | Burkey et al. | 257/231 |

FOREIGN PATENT DOCUMENTS

| | | | |
|---|---|---|---|
| 2025135 | 1/1980 | United Kingdom | 357/24 M |
| 2054961 | 2/1981 | United Kingdom | 357/24 M |

*Primary Examiner*—William L. Sikes
*Assistant Examiner*—Tai V. Duong
*Attorney, Agent, or Firm*—Steven R. Biren

[57] ABSTRACT

In CCD's, the major part of the dark current is caused by surface states. This dark current is disturbing, especially in image sensors, because the sensitivity of the camera is limited thereby. When according to the invention the integrating gates are varied periodically, the subjacent surface parts of the - buried - channel being brought periodically into inversion and into depletion, while maintaining the charge-containing capacity, a considerable reduction of the dark current can be obtained. In image sensors, voltage variation preferably occurs during the fly-back time.

5 Claims, 3 Drawing Sheets

CHARGE-COUPLED DEVICE, IMAGE SENSOR ARRANGEMENT AND CAMERA PROVIDED WITH SUCH AN IMAGE SENSOR ARRANGEMENT

This is a continuation of application Ser. No. 07/794,350, filed Nov. 12, 1991, abandoned, which is a continuation of Ser. No. 07/525,275 filed May 17, 1990, abandoned.

BACKGROUND OF THE INVENTION

The invention relates to a charge-coupled device of the buried channel type comprising a semiconductor body having a charge transport channel of the one conductivity type, which is located near a surface and passes via a pn junction into an adjoining layer of the second conductivity type opposite to the first conductivity type, the surface being provided with a series of successive electrodes, which are separated from the surface by an isolating layer and are connected to a voltage source for applying clock voltages having a blocking level and an active level, while in the charge transport channel a potential barrier or a potential well is induced, the blocking level being chosen so that inversion of the conductivity type occurs at the surface of the semiconductor body.

The invention further relates to an image sensor arrangement comprising such a charge-coupled device. The information can be supplied both electrically, i.e. from an external electric source via a separate input stage, and optically, the charge carriers being generated by absorption of incident radiation in the semiconductor body itself. In the former case, the charge-coupled device can be used as a memory or as a signal processor, while in the latter case it can be used as an image sensor or a sensor in a camera.

A charge-coupled device of the kind described in the opening paragraph is known inter alia from the article by N.J. Saks "A Technique for Suppressing Dark Current Generated by Interface States in Buried Channel CCD imagers", published in I.E.E.E. Electron Device Letters, Vol. ED-1, No. 7 (July 1980), pp. 131/133.

In charge-coupled devices, the leakage current or dark current is kept as low as possible. With the use of the device, for example, as a memory, the leakage current determines to a great extent the maximum storage time. In charge-coupled image sensor arrangements, the sensitivity is limited to a considerable extent by the dark current of the CCD. In general, as is know, a large part of the dark current is caused by surface states in the forbidden energy band. These states are used by the electrons as intermediate station when passing from the valency band to the conduction band. A considerable reduction of the dark current in CCD's can be attained in that these surface states are freed via recombination with holes from electrons before they have made the second step to the conduction band. A method suitable for this purpose consists in bringing the surface into inversion, as a result of which this surface is overflown with holes, as described in the aforementioned publication. This known arrangement is a CCD image sensor, in which during the integration period such a voltage is applied to the electrodes that the whole surface of the transport channel is in inversion. A disadvantage is that also the semiconductor surface below the integrating electrodes is in inversion. The charge separating function of the electrodes—usually by application of different voltages to the electrodes—is practically entirely eliminated due to the fact that the surface potential is practically entirely determined by the potential in the inversion layer. As already indicated in the publication, the separation between the successive charge packets should then be obtained in a different manner.

SUMMARY OF THE INVENTION

The invention has for its object to provide a charge-coupled device, in which the leakage current (dark current) can be kept low by means of recombination in an inversion layer and in which at the same time the charge separation can be realized in a usual manner, more particularly by means of suitable potential differences between the electrodes.

A charge-coupled device according to the invention is characterized in that the active level is chosen so that depletion occurs only at the surface, while during operation the surface parts of the charge transport channel corresponding to at least a part of the said electrodes are alternately brought into depletion, in which event signal charge can be stored below the electrodes, and into inversion.

In the device according to the invention, the part of the charge transport channel in which charge is stored is not permanently, but only periodically brought into inversion. The fact is then utilized that dark current generation via surface states (traps) is a process in which time constants play an important part. When the period in which a surface part is not in inversion, while information is stored in the associated part of the channel, is chosen sufficiently short, it can be avoided that an excessive quantity of traps are filled from the valency band with electrons and thus cause dark current. Although the overall dark current can be slightly larger than in the situation in which the whole surface of the channel is permanently brought into inversion, it has been found in practice that it is possible to keep the dark current very low in an arrangement according to the invention. At the same time, the charge can be stored in a comparatively deep potential well due to the local absence of an inversion layer, as a result of which successive charge packets can be satisfactorily separated from each other.

The invention can advantageously be used in various CCD systems, such as memory filters, signal processors, multiplex circuits and the like. Particular advantages are obtained in CCD image sensors, in which charge packets are stored during about a frame period of 20 m.sec of a T.V. system in a storage site.

An important preferred embodiment, in which crosstalk from the clock signal to the output signal is avoided as far as possible, is characterized in that in the period in which a charge packet is stored in the said charge storage site the voltages at the inner electrodes of this storage site are periodically varied in the period coinciding with the line fly-back time lying between the steps of reading out two successive lines.

BRIEF DESCRIPTION OF THE DRAWING

The invention will be described more fully with reference to an embodiment and the accompanying diagrammatic drawing, in which.

Figure 1:
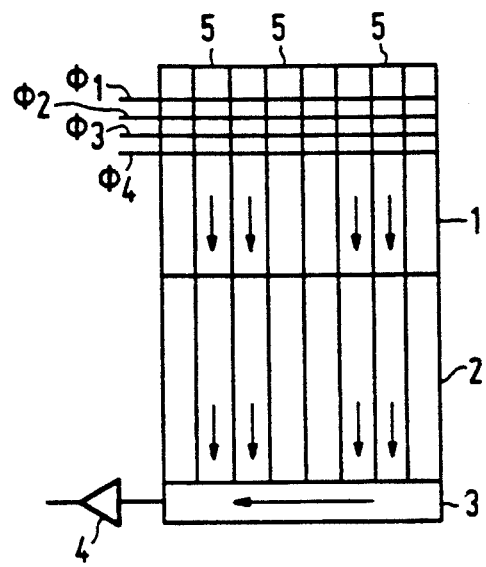
FIG. 1 shows the diagram of a CCD sensor of the FT type, in which the invention is used.
Figure 2:
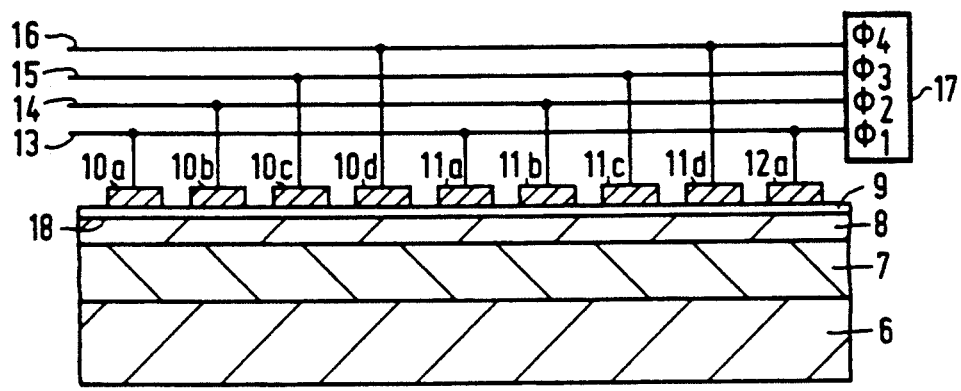
FIG. 2 is a longitudinal sectional view of one of the CCD registers in the sensor section of the arrangement of FIG. 1.

It should be noted that the drawings of FIGS. 1 and 2 are schematic and not to scale. It should be noted more particularly that, although in the diagram of FIG. 1 only eight parallel channels 5 are shown, this number will actually be considerably larger.

DESCRIPTION OF THE PREFERRED EMBODIMENTS

The invention will be described more fully with reference to a charge-coupled image sensor of the frame transfer type (FT). However, it should always be taken into account that the invention is not limited to the use in FT sensors, but can be used in any charge-coupled device with buried channel. FIG. 1 shows the known diagram of an FT sensor comprising an image sensor section 1, a memory section 2 and the horizontal read-out register 3, whose output is connected to an output amplifier 4. The sensor section 1 and the memory section 2 are constituted by a mat of charge transport registers 5, the upper part, which constitutes the sensor section 1 onto which the image to be sensed is projected, being accessible for radiation. The sections 2 and 3 are mostly made inaccessible for radiation, for example by means of an Al layer covering the surface of these sections. The charge transport takes place by applying clock voltages to clock electrodes, which are arranged above the sensor section 1, the memory section 2 and the horizontal read-out register 3. In FIG. 1, only four of the electrodes are shown with the associated clock voltages $\phi_1$, $\phi_2$, $\phi_3$ and $\phi_4$.

Figure 3:
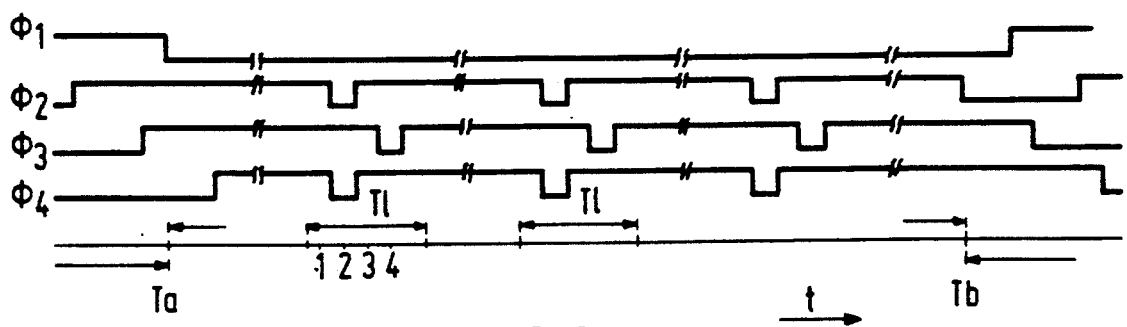
FIG. 3 shows the clock voltages $\phi_1$, $\phi_2$, $\phi_3$ and $\phi_4$ applied to the arrangement shown in FIG. 1 as a function of the time t.

FIG. 2 is a sectional view of the arrangement along part of a charge transport channel in the image sensor section, the charge transport taking place from the left to the right. The arrangement comprises an n-type substrate 6, which serves as a drain for generated charge carriers in the case of over-exposure. For this aspect, reference may be made to Netherlands Patent Application "Blooming-insensitive image sensor arrangement and method of manufacturing it", which has been filed in the name of the Applicant under Application No. 8304035 on 24 Nov. 1983 and has been laid open to public inspection on 17 June 1985. The n-type substrate 6 is provided at its surface with a comparatively thin p-type layer 7, which separates the n-type substrate 6 from the n-type surface layer 8 which constitutes one of the vertical CCD channels 5. The clock electrodes 10a, 10b, 10c, 10d, 11a, 11b, 11c etc. are arranged above the surface so as to be separated therefrom by the gate dielectric 9. In the drawing, the electrodes are shown one beside the other for the sake of clarity. Actually, however, the electrodes will overlap each other in part in the form of a multilayer wiring system. The electrodes are connected through the clock lines 13, 14, 15 and 16 to the voltage source 17, which supplies the clock voltages $\phi_1$, $\phi_2$, $\phi_3$ and $\phi_4$. It should be noted that the present arrangement constitutes a 4-phase CCD. It will appear from the following, however, that this is not necessary at all, but that also in any other known n-phase CCD system the invention may be used. The clock voltages $\phi_1$, $\phi_2$, $\phi_3$ and $\phi_4$, which are shown in FIG. 3 as a function of the time t, have two levels, i.e. a low level at which a potential barrier is induced in the layer 8 and a high level at which potential wells are induced below the electrodes, in which wells charge packets are stored. The low level is chosen so that at the interface 18 between the n-layer 8 and the dielectric layer 9 an inversion layer of positive holes is built up. According to the invention, the positive level of the clocks $\phi_1 \ldots \phi_4$ is chosen so that at this voltage the surface of the n-type layer 8 is not brought into inversion, but is at most depleted, that is to say that it is brought into a state in which no movable charge carriers are present at the surface. In order to avoid that too large a dark current generation occurs below the electrodes which are at the active voltage level, the voltage is varied so that the surface parts below these electrodes are alternately in depletion and in inversion.

Figure 5:
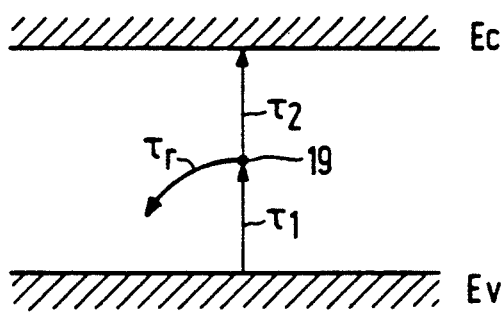
FIG. 5 shows the band diagram of silicon.

For the FT sensor described here, this means that in the image sensor section operated as a 4-phase CCD during the integration period in a series of five successive electrodes a charge storage site is limited by potential barriers below the first and fifth electrodes, for example in electrodes 10a, 11a. The voltage $\phi_1$ applied to the electrodes 10a, 11a is so low that below these electrodes inversion occurs. Alternating voltages varying between the active level and the blocking level are applied to the electrodes 10b, 10c, 10d, which during the integration period are at a D.C. voltage level during the integration period are at a D.C. voltage level during the integration period in conventional arrangement. As a result, the surface parts below these electrodes are periodically brought into inversion and into depletion. In order to avoid cross-talk to the output signal at the output 4, the voltages $\phi_2$, $\phi_3$ and $\phi_4$ are varied in the integration period only in the line fly-back time. The invention utilizes the fact that dark current generation is a process which is effected via traps and that time constants play an important part. In order to illustrate this, FIG. 5 shows the band diagram of silicon. The lowest band of occupied energy levels is indicated by Ev (valency band) and the band of permitted states lying above it is indicated by Ec (conduction band). About halfway the forbidden band, a trap 19 is indicated. After the traps or at least the major part of the traps are emptied by an inversion layer, they will be filled again from the valency band with electrons with a time constant $\tau_1$. At the same time, a number of electrons will flow from the traps to the conduction band Ec. This happens with a time constant $\tau_2$. The state of equilibrium is attained with a time constant $\tau_3$, for which it holds that:

$$\frac{1}{\tau_3} = \frac{1}{\tau_1} + \frac{1}{\tau_2}$$

Since the traps are distributed over the whole forbidden energy band, an average must be taken for $\tau_3$. It has been found in practice that a value of at least about 100 $\mu$sec can be chosen therefor. The charge integration in each image sensor cell (pixel) is now split up into periods having a duration T, in which the electrodes cause alternatively during a time Tinv an inversion layer and then are integrating during the time T-Tinv, i.e. induce a potential well. The time Tinv must be sufficiently long to cause a large number of electrons to recombine in the traps with holes from the inversion layer. The time constant $\tau r$ with which this happens proves to be about 10 μsec or shorter. The time T-Tinv will preferably be chosen to be shorter or of the order of $\tau_3$ in order to avoid that too large a number of traps are filled again.

FIG. 3 shows the clock diagram of $\phi_1$, $\phi_2$, $\phi_3$, $\phi_4$ as a function of the time t. In the period between Ta and Tb a trapped radiation pattern is converted in the image sensor section into a charge patterns. The period Ta-Tb is designated as the integration period. After the integration period, i.e. after Tb, the charge pattern formed is transported from the image sensor section to the memory section by means of 4-phase clocks. During the integration period, the image stored in the memory section is linewise read out via the horizontal read-out register 3. The period between two successive lines is designated as the line fly-back time and is indicated in FIG. 3 by Tl.

Figure 4:
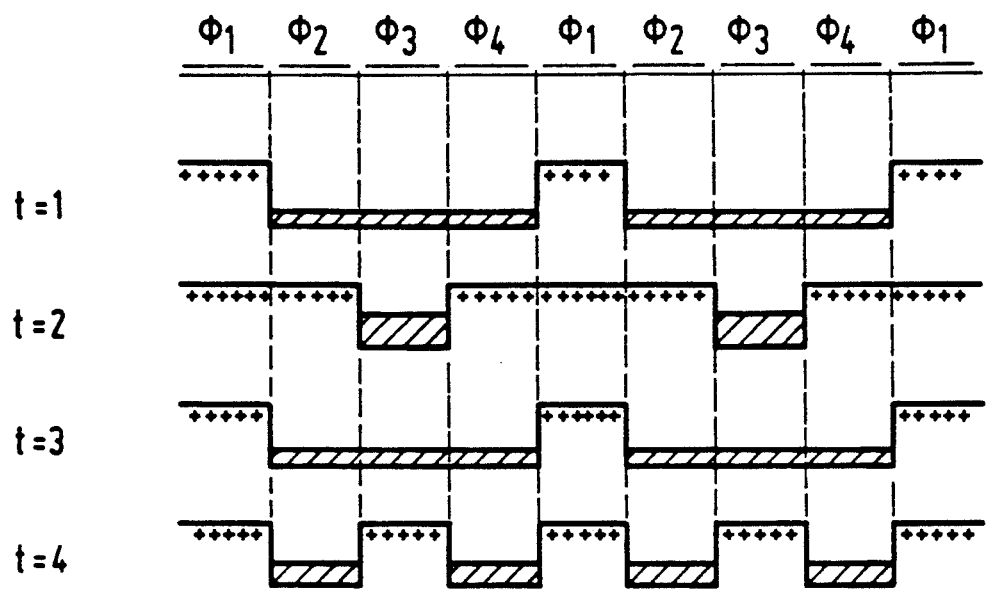
FIG. 4 shows the potential profiles in the CCD channel at these clock voltages at four instants.
Figure 6:
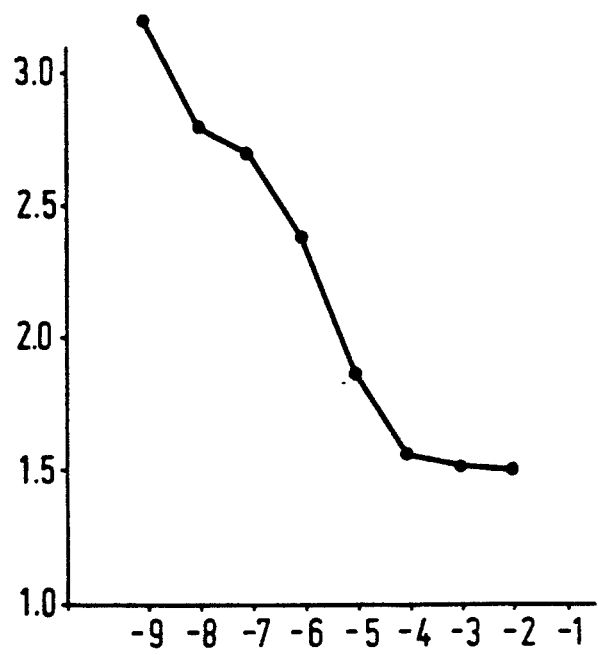
FIG. 6 shows the reduction of the leakage current as a function of the applied voltage.

In the integration period, which begins at Ta, $\phi_1$ is adjusted to the blocking level, as a result of which a potential barrier, which insulates adjacent potential wells from each other, is induced below the electrodes 10a, 11a, 12a during the whole integration period. For illustration, for a number of instants FIG. 4 shows the potential profile below a series of electrodes provided with the applied clocks $\phi_1$. The low level of the clocks is chosen so that inversion occurs below the electrodes, which is designated in FIG. 4 by plus symbols, which indicate the presence of holes. The remaining electrodes b, c and d are adjusted to, for example, a 10V higher level, as a result of which a potential well is induced below these electrodes without inversion; see FIG. 4 at the instant $t_1$. In conventional arrangements, the voltages at the electrodes in the sensor section are not varied during the integration period. In order to avoid that too many traps are filled with electrons below the integrating gates, in the arrangement according to the invention the voltage at the integrating gates is varied periodically. For example, first $\phi_2$ and $\phi_4$ may be reduced by 10V in voltage, while $\phi_3$ remains at the high level. This is indicated in FIG. 4 by the instant $t_2$. The charge is fully compressed below $\phi_3$, while inversion now also occurs below the electrodes $\phi_2$ and $\phi_4$. This situation is maintained until all or at least substantially all electrons trapped in the local traps are recombined with holes from the inversion layer. Subsequently, $\phi_2$ and $\phi_4$ are adjusted again to the high voltage level ($t_3$), after which ($t_4$) $\phi_3$ is reduced by 10V. The region below the electrodes connected to $\phi_4$ is now brought into inversion, as a result of which also the surface states below these electrodes are emptied. $\phi_4$ then also returns to the high level, as a result of which the situation of $t_1$ is obtained again, which is maintained till the next line fly-back time $t_1$. Thus, the dark current generation via surface states can be considerably reduced in that different surface parts are brought into inversion alternately and periodically. The improvement is plotted in FIG. 6 against the negative voltage at the electrodes upon inversion. According as the voltage decreases, as a result of which the concentration of holes in the inversion layer and hence the recombination of holes with trapped electrons increases, the dark current decreases. At a voltage of −9V, which is a suitable value for operating the sensor, the dark current is reduced by about a factor 3.

In the 4-phase embodiment described here, three out of four electrodes are at the active high voltage level during the integration period. As a result, there is integrated under three out of four electrodes, which is favorable in connection with obtaining the highest possible photosensitivity. During the charge transport after the integration period, the charges are compressed below two electrodes or possibly even below one single electrode. The excess quantity of charge can flow away by means of vertical anti-blooming to the substrate 6 in a conventional arrangements, the voltages not varying in the integration period. However, a part of the charge can then reach the surface and can be trapped there by traps, which may give rise to the so-called smear phenomenon due to the fact that they are released again only after some time during the transport. Due to the measure described here, in which the charge is regularly compressed during the integration period below two electrodes or one electrode, a possible excess quantity of charge carriers can be drained in time via the substrate, as a result of which the smear effect described above can be avoided.

Figure 7:
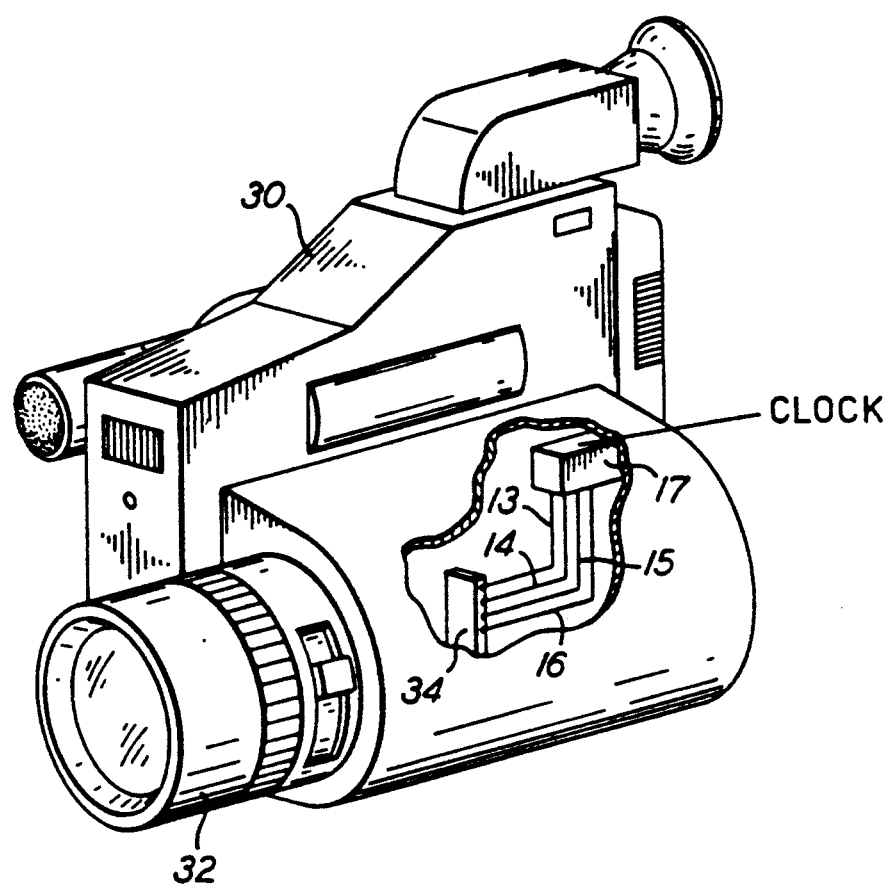
FIG. 7 is a diagrammatic view of a camera using a sensor in accordance with the invention.

A camera employing a sensor in accordance with this invention is illustrated in FIG. 7. The camera 30 includes a conventional lens 32 for projecting an image on sensor 34. The sensor 34 is connected by signal lines 13-16 to clock 17, as already described. Camera 30 is conventional except for the use of the sensor in accordance with this invention.

It will be appreciated that the invention is not limited to the embodiment described here, but that within the scope of the invention many further variations are possible for those skilled in the art. For example, the negative pulses of $\phi_2$ and $\phi_4$ for obtaining an inversion layer may be applied one after the other instead of simultaneously. The invention may also be used in charge-coupled devices other than described here.

I claim:

1. A method of operating a charge-coupled device of the buried channel type including a semiconductor body having a charge transport channel of a first conductivity type, which is located near a surface of the body, an adjoining layer of a second conductivity type opposite to the first conductivity type, forming a pn junction with the charge transport channel, a substrate of said first conductivity type beneath said adjoining layer, an isolating layer on the surface and a series of successive electrodes on the isolating layer, comprising the steps of applying clock voltages having a blocking level and an active level to the electrodes for inducing at least one of a potential barrier and a potential well in the charge transport channel, the blocking level being chosen such that the conductivity type of the charge transport channel is inverted at the surface of the semiconductor body and the active level being chosen such that the surface of the body is depleted, and, during operation of the device, alternately bringing surface parts of the charge transport channel beneath at least some of the electrodes, and into inversion to reduce dark current, and draining excess charge generated in said charge transport channel due to overexposure by means of vertical anti-blooming to said substrate.

2. A method as claimed in claim 1, in which the electrodes comprise at least a group of n+1 successive electrodes with n>3, which together define a charge storage site in the charge transport channel, and in which the step of applying clock voltages further comprises applying the blocking level during a charge storage period in which a charge packet is stored in said storage site to two outer electrodes of said n+1 electrodes and applying alternating voltages varying during the charge storage period between the blocking level and the active level to the electrodes located between said two outer electrodes to alternately bring the surface parts below these electrodes into inversion and into depletion.

3. A method as claimed in claim 2, in which the charge transport channel with associated channels forms part of an image sensor arrangement having a system of image sensor elements arranged in lines and columns and a system of transport channels which extend in the column direction, comprising the steps of transporting charge packets generated by absorption of radiation in the column direction and reading out the charge packets linewise.

4. A method system as claimed in claim 3, wherein said step of applying clocking voltages comprises the step of supplying voltages at inner electrodes of said storage site during the period in which a charge packet is stored in said storage site, said voltages being periodically varied during a line fly-back period between the reading out of two successive lines.

5. A method as claimed in claim 4, wherein said step of supplying voltages comprises the steps of supplying an active voltage to a first number of inner electrodes during the line fly-back period, supplying the active voltage to a second, greater number of inner electrodes during a period between two line fly-back periods, for temporarily reducing the surface area of a potential well formed under the electrodes, and draining excess charge carriers during said temporary reduction.

* * * * *